United States Patent [19]

Schutyser et al.

[11] Patent Number: 5,728,468
[45] Date of Patent: Mar. 17, 1998

[54] PHOSPHOROUS CONTAINING RESIN

[75] Inventors: Jan Andre Jozef Schutyser, Dieren; Antonius Johannes Wilhelmus Buser, Wehl; Andre Steenbergen, Arnhem, all of Netherlands

[73] Assignee: Akzo Nobel N.V., Netherlands

[21] Appl. No.: 256,078

[22] PCT Filed: Nov. 24, 1992

[86] PCT No.: PCT/EP92/02705

§ 371 Date: Aug. 3, 1994

§ 102(e) Date: Aug. 3, 1994

[87] PCT Pub. No.: WO93/11176

PCT Pub. Date: Jun. 10, 1993

[30] Foreign Application Priority Data

Nov. 27, 1991 [NL] Netherlands ............... 9101978

[51] Int. Cl.$^6$ ............... C08F 283/10
[52] U.S. Cl. ............... 428/415; 428/901; 525/502; 525/486; 525/488; 525/529; 525/530; 525/903; 528/108; 528/398; 528/400
[58] Field of Search ............... 428/415, 901; 525/502, 486, 488, 529, 530, 903; 528/108, 398, 400

[56] References Cited

U.S. PATENT DOCUMENTS

| | | | |
|---|---|---|---|
| 2,732,367 | 1/1956 | Shokal | 528/108 |
| 3,524,903 | 8/1970 | Hargis, Jr. | 260/837 |
| 4,600,754 | 7/1986 | Winner | 525/531 |
| 4,632,973 | 12/1986 | Beck | 528/98 |
| 4,708,981 | 11/1987 | Zupancic et al. | 525/59 |
| 4,973,631 | 11/1990 | McGrath et al. | 525/534 |
| 5,036,135 | 7/1991 | Von Gentzkow et al. | 528/28 |
| 5,066,735 | 11/1991 | Walker et al. | 525/482 |
| 5,110,867 | 5/1992 | Schutyser et al. | 525/903 |
| 5,210,157 | 5/1993 | Schutyser et al. | 525/502 |
| 5,376,453 | 12/1994 | Von Gentzkow et al. | 428/415 |

FOREIGN PATENT DOCUMENTS

| | | | |
|---|---|---|---|
| 384940 | 9/1990 | European Pat. Off. | C08G 59/30 |
| 1159821 | 7/1969 | United Kingdom | D06M 15/44 |

OTHER PUBLICATIONS

Chemical Abstracts 121:59753, "Phosphate Ester Epoxy–Phenolic Resin Interpenetrating Network Coatings", Rao et al.

Derwent Patent Abstract No. 86–209590 (Abstracting JP 61–143,465 (1986).

"Phosphorus–Containing Polymers", Kirk–Othmer Encyclopedia of Polymer Science and Engineering, vol. 11, pp. 96–126 (1988).

Journal of Polymer Science:Macromolecular Reviews, vol. 12, 141–180 (1977).

*Primary Examiner*—Frederick Krass
*Attorney, Agent, or Firm*—Richard P. Fennelly; Louis A. Morris

[57] ABSTRACT

The invention relates to an organic phosphorus compound-containing which comprises an interpenetrating polymer network (IPN) produced by polymerizing free-radically polymerizable monomers comprising at least an allyl group-containing monomer and an epoxy resin.

8 Claims, No Drawings

PHOSPHOROUS CONTAINING RESIN

The present invention relates to organic phosphorus compound-containing polymeric resin.

Such a resin is known from European Patent Application 89103802.8, published as EP-A-384 940. In this publication an epoxy resin mixture is disclosed composed of an aromatic and/or heterocyclic epoxy resin free of phosphorus, an epoxy groups-containing phosphorus compound, and a particular aromatic polyamine as hardener. With no flame retardants being added, the resin is found to have a certain degree of refractoriness or fireproofness. This makes it possible for a key ingredient of many present-day flame retardants, bromine, which is not very environment-friendly, to be replaced.

Organic phosphorus compounds are indeed advisable bromine replacements. However, at least two drawbacks apply here. Firstly, it is generally found that the desired results, particularly with regard to Tg-value, are not obtained if phosphorus compounds are incorporated into known resins. This is also mentioned in said European Patent Application. Secondly, the degree to which phosphorus compounds can be employed in an environmentally safe manner has been insufficiently established. Hence it is preferred to use phosphorus compounds in the smallest possible quantity while maintaining sufficient flame retardancy (fireproofness, refractoriness), a significant demand which these days is notably made of the types of resins used in the electronics industry. Further, it is advisable from an economic point of view to be able to incorporate also relatively simple phosphorus compounds into resins, in which process the resin should retain favourable properties.

In U.S. Pat. No. 3,524,903 a flame retardant vinyl ester resin is disclosed. The resin is prepared by reacting a polyepoxide with an ethylenically unsaturated carboxylic acid and an alkyl hydrogen phosphate ester.

Essentially, the polyepoxide is not employed as an epoxy resin, but is converted to vinyl ester resin. Flame retardance is attained by virtue of the phosphorus compound only in conjunction with halogen, which typically is introduced via the polyepoxide (using, e.g., tetrabromo bisphenol-A epoxide) in an amount of about 10–20 wt %. Hence, U.S. Pat. No. 3,524,903 does not provide any teaching on the desired replacement of halogen.

U.S. Pat. No. 4,708,981 discloses a phosphorus or sulfur containing interpenetrating polymer network (IPN) comprising a mixture of a host polymer and a guest polymer, the host polymer being formed from phosphoric acids or sulfuric acid and a polymer or copolymer of a compound which possesses repeat units selected from the group consisting of hydroxyethylene poly(vinyl alcohol), ethylene imine, (meth) acrylic acid, N-vinylimidazole, ethylene oxide, (N-substituted) acrylamide, vinyl pyridine, vinyl sulfonic acid, ethyl oxazoline, and phenol formaldehyde resins, the guest polymer being formed from certain monofunctional acrylic monomers and a difunctional cross-linking agent such as methylene bisacrylamide. The IPN is suitable as a gas separation membrane.

U.S. Pat. No. 4,600,754 discloses a process for polymerizing ethylenically unsaturated monomers in the presence of epoxy resin. First, the epoxy resin is reacted with a source of phosphoric acid, and then the ethylenically unsaturated monomers are polymerized under free radical initiating conditions, a requirement being that at least one of the ethylenically unsaturated monomers is a carboxyl functional monomer.

In GB 1,159,821 a fire retardant impregnant composition is disclosed which comprises an epoxy ether, a curing agent therefor, and a neutral organophosphorus ester.

The invention has for its object to provide resins into which many conceivable phosphorus compounds may be incorporated without this giving serious drawbacks such as inhomogenity of the reaction mixtures or instability of the uncured product prior to prepreg production. Another object of the invention is providing favourable resins, particularly with regard to properties such as a low dielectric constant, a low electrical dissipation factor, a high Tg, ready processability, high dimensional stability and a high solvent resistance, that display acceptable flame retardance without the need for halogen, notably bromine, being present. The invention also envisages providing resins in which comparatively small quantities of phosphorus are required to obtain sufficient flame retardancy. Furthermore the invention envisages resin compositions that can be dissolved in relatively environment-friendly solvents such as methyl ethyl ketone.

To this end the invention resides in the organic phosphorus compound-containing polymeric resin comprising an interpenetrating polymer network (IPN) composed of monomers polymerisable under the influence of radicals which has at least an allyl group-containing monomer and an epoxy resin. More particularly, the polymeric resin is an interpenetrating polymer network according to EP-A-413 386 or EP-A-417 837. Said two European Patent Applications laid open for public inspection are hereby incorporated by reference into the present text. Of course, the embodiments described in said publications in which the resin has acquired fireproofness due to the addition of bromine do not bear on the present invention.

On the contrary, the present invention is based on the inventive recognition that it is precisely into resins of this specific IPN type that organic phosphorus compounds can be incorporated extremely conveniently. Such compounds are then added to the mixture of ingredients capable of forming an IPN of the aforementioned type. Thus the resin according to the present invention consists of an interpenetrating network composed of an allyl polymer network and an epoxy resin network, with at least one of the networks comprising a chemically incorporated phosphorus compound.

It should be stressed that the resin of the invention is distiguished from the vinyl ester resin of U.S. Pat. No. 3,524,903: in the known resin the polyepoxide is reacted with carboxylic acid groups so as to form an ester, the ester being unsaturated (vinyl ester) due to the unsaturation present in the selected carboxylic acids. While the unsaturation may be allylic, the resulting composition is not an interpenetrating polymer network and, what is more, does not contain an epoxy resin network, as the polyepoxide is converted to vinyl ester resin.

As a further background to and elucidation of IPN technology reference is made to L. H. Sperling in *J. Polymer Sci.: Macromolecular Reviews*, Vol. 12, pp 141–180 (1977).

In principle, any organic phosphorus (preferably pentavalent phosphorus) compound having a functional group reactive towards an ingredient of the IPN-forming monomer mixture may be employed. More particularly, it is of advantage to employ an organic phosphorus compound as a full or partial substitute for one of the three main constituents of the IPNs of the present invention, viz. phosphorus-containing allyl compounds, phosphorus-containing epoxy compounds, or phosphorus-containing epoxide crosslinking agent. A proper example of the latter is a phosphorus-containing polyhydric phenol compound, e.g. as described in U.S. Pat. No. 4,973,631. It is preferred to introduce phosphorus by employing phosphorus-containing epoxy resin.

The phosphorus-containing resin according to the present invention is prepared in a manner analogous to the preparative processes described in EP-A-413 386 and EP-A-417 837. The exact preparative technique followed is of course dependent on which of the aforementioned types of phosphorus compounds is employed, but can be implemented by the man skilled in the art without undue experimental efforts.

A preferred embodiment of the present invention consists in that the IPN is prepared from a resin mixture of which 30 to 60 wt. % is comprised of a cyclic allyl compound, i.e., a polyallyl compound having a ring structure. Such allyl compounds may be employed either in the monomeric or in the oligomeric (prepolymeric) form. Suitable polyallyl compounds in this case include triallyl cyanurate (TAC), triallyl isocyanurate (TAIC), and aromatic polyallyl esters, such as diallyl phthalate, diallyl isophthalate, diallyl terephthalate, triallyl trimellitate, and tetraallyl pyromellitate. Further preference is given to TAC prepolymer being used. The preparation of such a prepolymer is described in EP 413 386 mentioned hereinbefore and incorporated herein by reference. In the case of such allyl compounds being employed, phosphorus is best introduced in the form of an epoxy compound or as a cross-linking agent for the epoxy resin, with preference being given to the former, particularly in view of the homogeneous reaction mixture obtained. More preferred is the use of a phosphorus compound having a comparatively high phosphorus content, preferably of more than 10 wt. %. As an example may be mentioned phenyldiglycidyl phosphonate, which contains 11 wt. % of phosphorus.

As stated hereinbefore, preference is given as a rule to the smallest possible quantity of phosphorus compounds being present. In this connection mention may be made of embodiments in which phosphorus is present in less than 5 wt. %, more particularly in less than 2%. Needless to say, it is of importance in such cases to attain a proper degree of fireproofness, which generally means: V-0 classification in accordance with the UL-94 test known to the skilled man. It is pertinent to note that a preferred embodiment of the invention consists in that use is made of nitrogen-containing allyl compounds, notably TAC, in combination with such a quantity of a phosphorus-containing compound that 2% or less of phosphorus will suffice to obtain a V-0 classification.

In IPNs according to the preferred embodiment indicated above the phosphorus-containing ingredients preferably used are: phosphorus-containing epoxy compounds as described in EP 384 940, notably when prepared in a basic medium by the reaction of epichlorohydrin with organophosphorus compounds preferably containing two or more hydroxyl groups. A proper example of this is the conversion of phenylphosphonic acid in diglycidyl phenylphosphonate; epoxy resins prepared by reacting an excess of conventional epoxy resin with phosphoric acid, alkylphosphonic acid, arylphosphonic acid, or organic acid phosphates, such as Nourycryl®MP12. These phosphorus compounds are known per se, cf. e.g. *Encyclopaedia of Polymer Science & Engineering*, Vol. 11, p. 125 ff. Alternatively, it is possible to react phenylphosphonic acid with bisphenol-A-bisepoxide, which leads to a readily usable linear polyester with terminal epoxy groups. Also, epoxides prepared from the reaction of phosphorus-containing aromatic diols, diamines, or mixtures thereof with epichlorohydrin may be employed as epoxy-containing compounds.

Suitable examples of phosphorus-containing aromatic diols, which may be used in the preparation of phosphorus-containing epoxy resins as described above but also as a cross-linking agent for the epoxy resin in the present phosphorus-containing IPNs, are reaction products of dihydroxy aromatic compounds with a less than stoichiometric amount of phenylphosphonic acid dichloride, phenylphosphonthionyl dichloride, or mixtures thereof. More preferably, the aromatic diol used is hydroquinone, which may give a compound of the following type: $\psi$-P(=O)—(O—$\psi$—OH)$_2$, wherein $\psi$ represents a phenyl ring. Other examples include di-p-hydroxy-triphenylphosphine oxide, tris(4-hydroxy benzyl)phosphine oxide. Alternatively, advantageous results can be attained using polyhydroxy aromatic compounds, such as phenol Novolak or cresol Novolak of which at least a portion of the hydroxyl groups is esterified with di-phenyl-P(=O)chloride. Such compounds are known from, int. al., JP-A-61/143 465. Adducts of phosphorus containing epoxy resins and aromatic diols are also very suitable, particularly in view of their favourable flowing at higher temperatures.

Aromatic, phosphorus-containing polyamines which can be employed in a manner analogous to that in which the above-mentioned hydroxy compounds are employed are, int. al., di-p-amino triphenylphosphine oxide and di(m-aminophenoxy) triphenylphosphine oxide, but also include reaction products of phenylphosphonic acid dichloride or phenylphosphonthionyl dichloride with an excess of aromatic amine.

It holds for all embodiments of the present invention that in all cases also mixtures of phosphorus-containing compounds may be used. Further, it possible to employ different types of phosphorus compounds side by side. Thus, e.g., both the epoxy resin and the cross-linking agent therefor may simultaneously comprise a phosphorus compound. Alternatively, both a phosphorus-containing epoxide and a phosphorus-containing cross-linking agent may be employed in combination with a phosphorus-containing allyl compound. Of course, also all the IPN ingredients may be provided with phosphorus-containing compounds. In all of these embodiments a phosphorus-containing monomer copolymerisable with the allyl ingredient of the IPN may be employed either in addition to a phosphorus-containing allyl compound or instead of it. As phosphorus-containing allyl compounds may be mentioned allyl esters of known phosphorus-containing acids, e.g. diallyl phenylphosphonate. Examples of phosphorus-containing copolymerisable monomers are phosphorus-containing methacrylates, such as Nourycryl®MP12 mentioned hereinbefore.

The resins according to the present invention can advantageously be employed in the electronics industry. Analogous to the description in EP-A-413 386 and EP-A-417 837, the present phosphorus-containing resins are eminently suited to be used, reinforced with a reinforcing material, such as glass fibre or glass cloth, or not, in laminates serving as substrates for printed wiring boards.

The invention is further illustrated with reference to the following unlimitative Examples.

DETERMINATION OF PROPERTIES

The coefficient of thermal expansion (CTE) and Tg were determined with the aid of a Dupont Thermal Mechanical Analyzer (TMA), basic module 990 with TMA module 942, at 100 ml/min in an atmosphere of nitrogen. The values were determined during heating (5° C./min) as well as cooling (2° C./min).

The decomposition behaviour of neat resins was studied with the aid of a Dupont Thermo-Gravimetric Analyzer (TGA), basic module 990 with TGA module 951, at a heating rate of 10° C./min in an atmosphere of nitrogen. The study of laminates was conducted in air.

Cured resins were tested manually for fire retardancy, with the sample to be tested being held vertically in a flame for 10 seconds. The sample was considered to be fire retardant if it ceased burning immediately upon being removed from the flame.

EXAMPLE 1

A phosphorus-containing IPN resin in accordance with the present invention was prepared on the basis of a phosphorus-containing epoxide in the following manner.

Di(1,2-epoxypropyl)phenyl phosphonate (hereinafter referred to as phosphor-epoxy) was prepared as follows:

Into a three-necked flask of 250 ml provided with a digital thermometer, a stirrer, a coil cooler and a dropping funnel, 150 g of toluene, 40.71 g (0.40 moles) of triethyl amine, and 33.43 g (0.433 moles) of glycidol 96% were introduced, under $N_2$ flow. At a temperature of −10° C. 38.9 g (0.20 moles) of dichlorophenyl phosphine oxide were added from the dropping funnel in 1.5 hours. Thereafter the stirred reaction mixture was slowly allowed to reach room temperature overnight, after which triethyl amine hydrochloride was filtered off, and the residue was washed with toluene. The toluene was driven off using a vacuum evaporator, after which 58.47 g phosphor-epoxy (molar mass 270.22 g/mole) were obtained. The phosphorus content was determined to be 11.46%.

Phosphor-epoxy was used as an epoxy compound in an IPN formulation in the following manner:

41.2 g of a 60% solution of an epoxy cresol Novolac resin (epoxy equivalent weight of 230 for 100% solids and an epoxy functionality of 4.1) in methylethyl ketone (MEK), 17.3 g of the above-prepared phosphor epoxy, and 15.8 g of maleic anhydride were mixed with 45.8 g of an 85% solution of TAC prepolymer in MEK. The TAC prepolymer had a monomer conversion of 41%, a number average molecular weight (Mn) of 6500, and a degree of dispersion (D) of 16 (determined by HPLC vis-aà-vis styrene standards). The prepolymer with a (Brookfield) viscosity of 1600 mPa.s at 23° C. was prepared in a manner analogous to that described in EP-A-413 386 and EP-A-417 837. However, to limit the molecular weights 1.5 wt. % of carbon tetrabromide (vis-à-vis the TAC monomer) were additionally added as chain transfer agent.

Based on 100% solids, the composition thus contained 40.3% of TAC prepolymer, 17.9% of phosphor epoxy, 25.5% of epoxy cresol Novolac, 16.3% of maleic anhydride, and 2% of phosphorus. To the mixture, which contained 19.5% of MEK, were added 0.620 g of a 10% solution of 2-methyl imidazole in 2-methoxy-1-propanol (i.e., 0.1 wt. % of solid catalyst vis-à-vis epoxy plus curing) and, subsequently, 0.4 g of tert.butylperoxy perbenzoate (i.e., 1 wt. % vis-à-vis TAC). The resin solution was then so poured into aluminium dishes as to give a layer thickness for the resin solution of about 1 mm. Next, the samples were heated to 60° C. in a forced-circulation air oven for 1 hour. The temperature of the oven was then successively raised to, and kept at: 100° C. for 1 hour, 150° C. for 2 hours, and 180° C. for 30 minutes.

After the yellowish brown, homogeneously transparent plates had been cooled slowly and released from the mould, the samples were postcured at 200° C. for a further 2 hours before being cooled down to room temperature.

The following properties were measured on the flat, cured plates of about 1 mm in thickness:

| | |
|---|---|
| Tg (°C.) by TMA | 178 |
| CTE (ppm/°C.) average (over 20°–250° C.) | 120 |
| TGA (in an atmosphere of nitrogen) | |
| loss at 300° C. (%) | 2.0 |
| decomposition maxima | 342 and 425 |
| residue at 650° C. (%) | 27 |
| Manual flame test, fire retardant? | yes |

EXAMPLE 2

Analogous to the description in Example 1 a resin was formulated based on a 100% solid composition of 39.5 parts of TAC prepolymer (for characteristics cf. Example 1), 17.0 parts of phosphor epoxy, 24.8 parts of epoxy phenol Novolac (epoxy equivalent weight of 178, epoxy functionality of 3.5), and 18.7 parts of maleic anhydride. The composition contained 2% of phosphorus, 1% of peroxide, and 0.25% of 2-methyl imidazole.

| Properties: | |
|---|---|
| Tg (°C.) by TMA | 157 |
| CTE (ppm/°C.) average (over 20°–250° C.) | 118 |
| TGA (in an atmosphere of nitrogen) | |
| loss at 300° C. (%) | 1.6 |
| decomposition maxima (°C.) | 342 and 430 |
| residue at 650° C. (%) | 28 |
| Manual flame test, fire retardant? | yes |

EXAMPLE 3

Analogous to the description in Example 1 a resin was formulated based on a 100% solid composition of 40 parts of TAC prepolymer (for characteristics cf. Example 1), 18.4 parts of phosphor epoxy, 20.7 parts of epoxy cresol Novolac (for characteristics cf. Example 1), 7.5 parts of maleic anhydride, and 13.4 parts of nadic methyl anhydride (i.e., methylbicyclo [2.2.1]hept-5-ene-2,3-dicarboxylic anhydride). The composition had a phosphorous content of 2.1% and the same relative amounts of catalyst and peroxide as in Example 1.

| Properties: | |
|---|---|
| Tg (°C.) by TMA | 164 |
| CTE (ppm/°C.) average (over 20°–250° C.) | 150 |
| Manual flame test, fire retardant? | yes |

We claim:

1. A resin comprising a chemically incorporated organic phosphorus compound, characterized in that it comprises an interpenetrating polymer network (IPN) produced by polymerizing monomers comprising an allyl group-containing monomer, an epoxy resin, and an epoxide crosslinking agent.

2. A resin according to claim 1, characterized in that the resin comprises an organic compound of pentavalent phosphorus.

3. A resin according to claim 1 or 2, characterized in that at least one of the IPN-forming networks comprises a chemically bonded organic phosphorus compound.

4. A resin according to claim 3, characterized in that the organic phosphorus compound is a phosphorus-containing epoxide.

5. A resin according to claim 4, characterized in that the IPN is prepared from a monomer mixture of which 30 to 60 wt. % is comprised of a cyclic allyl compound.

6. A resin according to claim 5, characterized in that the allyl compound is triallyl cyanurate (TAC), triallyl isocyanurate (TAIC), an oligomer thereof, or a mixture of TAC and TAIC monomer or oligomer.

7. A laminate comprising at least one layer of synthetic material and at least one layer of metal, optionally in the form of a printed circuit, characterized in that the layer of synthetic material consists of an IPN, optionally reinforced with fibres, according to any one of the preceding claims.

8. An organic phosphorus compound-containing resin comprising an organic compound of pentavalent phosphorus, characterized in that it comprises an interpenetrating polymer network (IPN) produced by polymerizing monomers comprising 30 to 60 wt % of a cyclic allyl group-containing monomer selected from the group consisting of triallyl cyanurate (TAC), triallyl isocyanurate (TAIC), an oligomer thereof, and a mixture of TAC and TAIC monomer or oligomer, an epoxy resin, and an epoxide crosslinking agent at least one of the IPN-forming networks comprising chemically bonded di(1,2-epoxypropyl)phenyl phosphate.

* * * * *